(12) United States Patent
Zhu et al.

(10) Patent No.: US 7,781,817 B2
(45) Date of Patent: Aug. 24, 2010

(54) STRUCTURES, FABRICATION METHODS, AND DESIGN STRUCTURES FOR MULTIPLE BIT FLASH MEMORY CELLS

(75) Inventors: Huilong Zhu, Poughkeepsie, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/146,500

(22) Filed: Jun. 26, 2008

(65) Prior Publication Data

US 2009/0321808 A1    Dec. 31, 2009

(51) Int. Cl.
*H01L 27/108* (2006.01)
(52) U.S. Cl. ...................... 257/302; 438/593
(58) Field of Classification Search ................ 257/315, 257/E21.209, 314, 324; 438/287, 268, 582
See application file for complete search history.

(56) References Cited

U.S. PATENT DOCUMENTS

| 6,933,558 | B2 * | 8/2005 | Hill et al. .................... 257/324 |
| 6,963,104 | B2 | 11/2005 | Wu et al. |
| 7,115,476 | B1 * | 10/2006 | Izumida ..................... 438/268 |
| 2001/0029077 | A1 | 10/2001 | Noble et al. |
| 2006/0258096 | A1 | 11/2006 | Noble et al. |
| 2007/0069281 | A1 | 3/2007 | Noble et al. |

* cited by examiner

*Primary Examiner*—Thanh V Pham
*Assistant Examiner*—Mark A Laurenzi, III
(74) *Attorney, Agent, or Firm*—Schmeiser, Olsen & Watts; Joseph Petrokaitis

(57) ABSTRACT

A semiconductor structure, a fabrication method, and a design structure of the same. The semiconductor structure includes (i) a semiconductor substrate which includes a top substrate surface perpendicular to the top substrate surface, (ii) a control gate electrode region and a first semiconductor body region on the semiconductor substrate, and (iii) a second semiconductor body region on the first semiconductor body region. The semiconductor structure further includes (i) a first gate dielectric region sandwiched between the first semiconductor body region and the control gate electrode region and (ii) a second gate dielectric region sandwiched between the second semiconductor body region and the control gate electrode region. The second semiconductor body region overlaps the first semiconductor body region in the reference direction. A first thickness of the first gate dielectric region is different from a second thickness of the second gate dielectric region.

13 Claims, 15 Drawing Sheets

STRUCTURES, FABRICATION METHODS, AND DESIGN STRUCTURES FOR MULTIPLE BIT FLASH MEMORY CELLS

FIELD OF THE INVENTION

The present invention relates generally to memory cells and more particularly to structures, fabrication methods, and design structures for multiple bit flash memory cells.

BACKGROUND OF THE INVENTION

A conventional multiple bit memory cell can store more than one bit of information. However, the memory cell can occupy a large wafer area. Therefore, there is a need for structures, fabrication methods, and design structures for a multiple bit memory cell that occupies less wafer area than that of the prior art.

SUMMARY OF THE INVENTION

The present invention provides a semiconductor structure, comprising a semiconductor substrate which includes a top substrate surface, wherein the top substrate surface defines a reference direction that is perpendicular to the top substrate surface; a control gate electrode region on the semiconductor substrate; a first semiconductor body region on the semiconductor substrate; a second semiconductor body region on the first semiconductor body region, wherein the second semiconductor body region overlaps the first semiconductor body region in the reference direction; a first gate dielectric region on side walls of the first semiconductor body region, wherein the first gate dielectric region is sandwiched between the first semiconductor body region and the control gate electrode region; and a second gate dielectric region on side walls of the second semiconductor body region, wherein the second gate dielectric region is sandwiched between the second semiconductor body region and the control gate electrode region, wherein a first thickness of the first gate dielectric region is different from a second thickness of the second gate dielectric region, and wherein the first gate dielectric region overlaps the second gate dielectric region in the reference direction.

The present invention provides structures, fabrication methods, and design structures for a multiple bit memory cell that occupies less wafer area than that of the prior art.

DETAILED DESCRIPTION OF THE INVENTION

FIGS. 1-24 illustrate a fabrication process of a semiconductor structure 100, in accordance with embodiments of the present invention. More specifically, with reference to FIG. 1 (cross-section view), the fabrication process of the semiconductor structure 100 can start with a substrate 110. The substrate 110 can comprise silicon. Assume that NFETs (N-channel Field Effect Transistors) are to be formed on the substrate 110.

Next, in one embodiment, a semiconductor layer 115 is formed on top of the substrate 110. The semiconductor layer 115 can comprise SiGe (a mixture of silicon and germanium). The thickness of the SiGe layer 115 in a direction defined by an arrow 110" (hereafter can be referred to as the direction 110") can be around 10-50 nm. The direction 110" is perpendicular to the top surface 110' of the substrate 110 and points from the SiGe layer 115 into the substrate 110. The SiGe layer 115 can be formed by epitaxially growing SiGe on top of the substrate 110.

Figure 1:
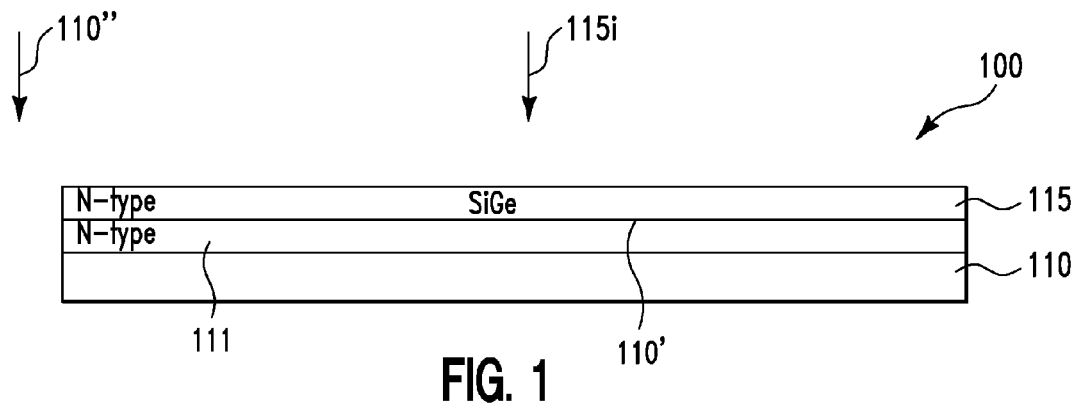
FIG. 1 shows a cross-section view of a fabrication process of a semiconductor structure, in accordance with embodiments of the present invention.

Next, in one embodiment, an ion implantation process 115i with n-type dopants (e.g., phosphor atoms) is performed on the SiGe layer 115 and the substrate 110 resulting in the n-type doped SiGe layer 115 and a doped silicon layer 111 of the substrate 110, as shown in FIG. 1. More specifically, the ion implantation process 115i can be performed in the ion bombardment direction 110".

Figure 2:
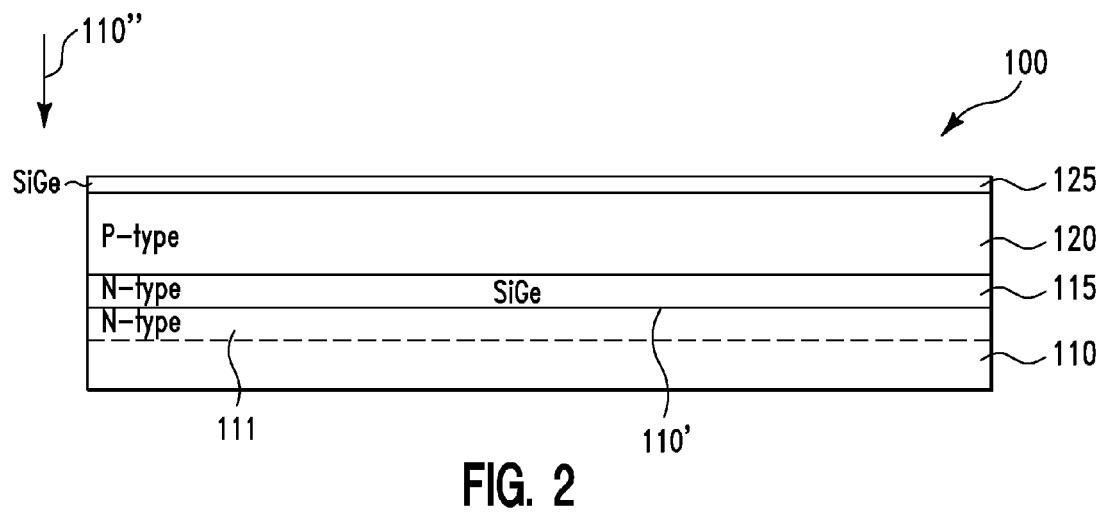
FIG. 2 shows a cross-section view of a semiconductor structure resulting from forming a first p-type doped silicon layer and a first semiconductor layer on the structure of FIG. 1, in accordance with embodiments of the present invention.

Next, with reference to FIG. 2, in one embodiment, a p-type doped silicon layer 120 is formed on top of the n-type doped SiGe layer 115. The p-type doped silicon layer 120 comprises silicon doped with p-type dopants (e.g., boron atoms). The thickness of the p-type doped silicon layer 120 in the direction 110" can be around 10-100 nm. The concentration of the p-type dopants in the p-type doped silicon layer 120 can be around 1e16-1e19 dopant atoms/cm3. The p-type doped silicon layer 120 can be formed by epitaxially growing silicon with in-situ p-type dopants.

Next, in one embodiment, a semiconductor layer 125 is formed on top of the p-type doped silicon layer 120. The semiconductor layer 125 can comprise SiGe. The thickness of the SiGe layer 125 in the direction 110" can be around 5-10 nm. The SiGe layer 125 can be formed by epitaxially growing SiGe on top of the p-type doped silicon layer 120.

Figure 3:
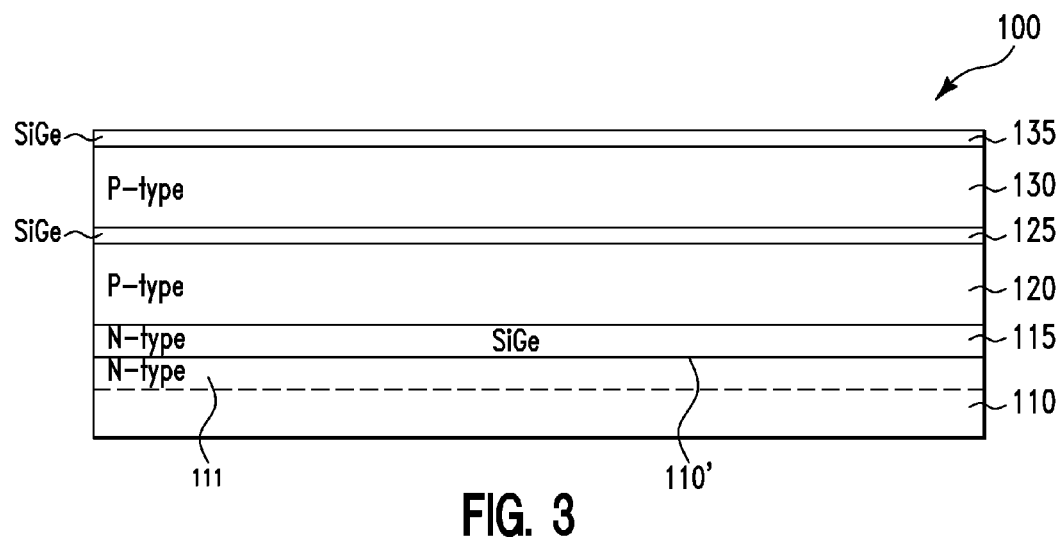
FIG. 3 shows a cross-section view of a semiconductor structure resulting from forming a second p-type doped silicon layer and a second semiconductor layer on the structure of FIG. 2, in accordance with embodiments of the present invention.

Next, with reference to FIG. 3, in one embodiment, a p-type doped silicon layer 130 and a SiGe layer 135 are formed on top of the SiGe layer 125. The p-type doped silicon layer 130 and the SiGe layer 135 are similar to the p-type doped silicon layer 120 and the SiGe layer 125 of FIG. 2, respectively. The formation of the p-type doped silicon layer 130 and the SiGe layer 135 can be similar to the formation of the p-type doped silicon layer 120 and the SiGe layer 125 of FIG. 2.

Figure 4:
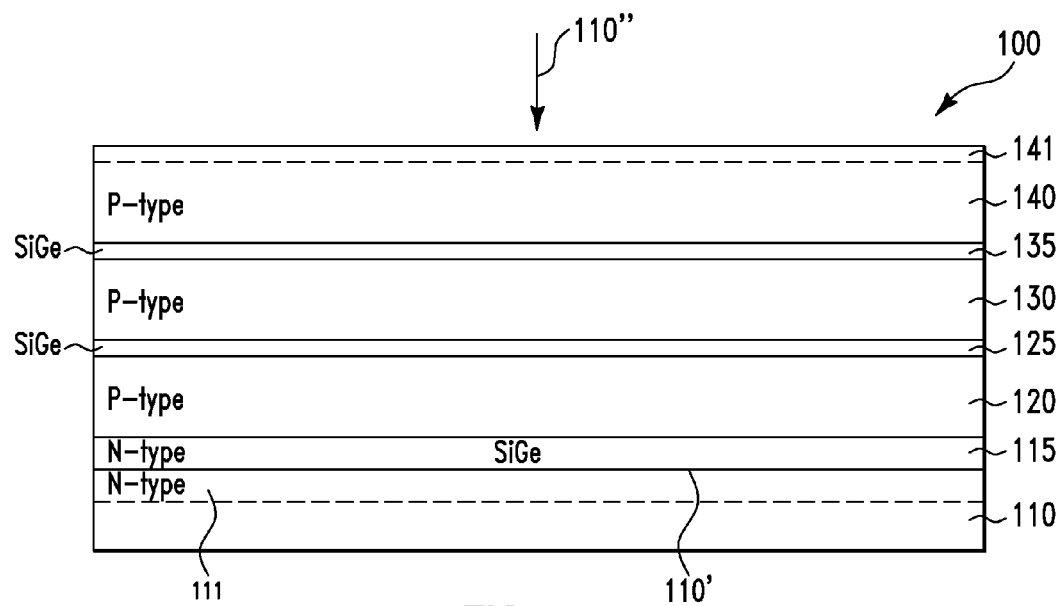
FIG. 4 shows a cross-section view of a semiconductor structure resulting from forming a third p-type doped silicon layer and an n-type doped silicon layer on the structure of FIG. 3, in accordance with embodiments of the present invention.

Next, with reference to FIG. 4, in one embodiment, a p-type doped silicon layer 140 is formed on top of the SiGe layer 135. The p-type doped silicon layer 140 is similar to the p-type doped silicon layer 120. The formation of the p-type doped silicon layer 140 can be similar to the formation of the p-type doped silicon layer 120.

Next, in one embodiment, an n-type doped silicon layer 141 is formed at top of the p-type doped silicon layer 140. More specifically, the n-type doped silicon layer 141 can be formed by ion implanting n-type dopants (e.g., phosphor atoms) into the p-type doped silicon layer 140 in the direction 110" resulting in the n-type doped silicon layer 141.

Figure 5:
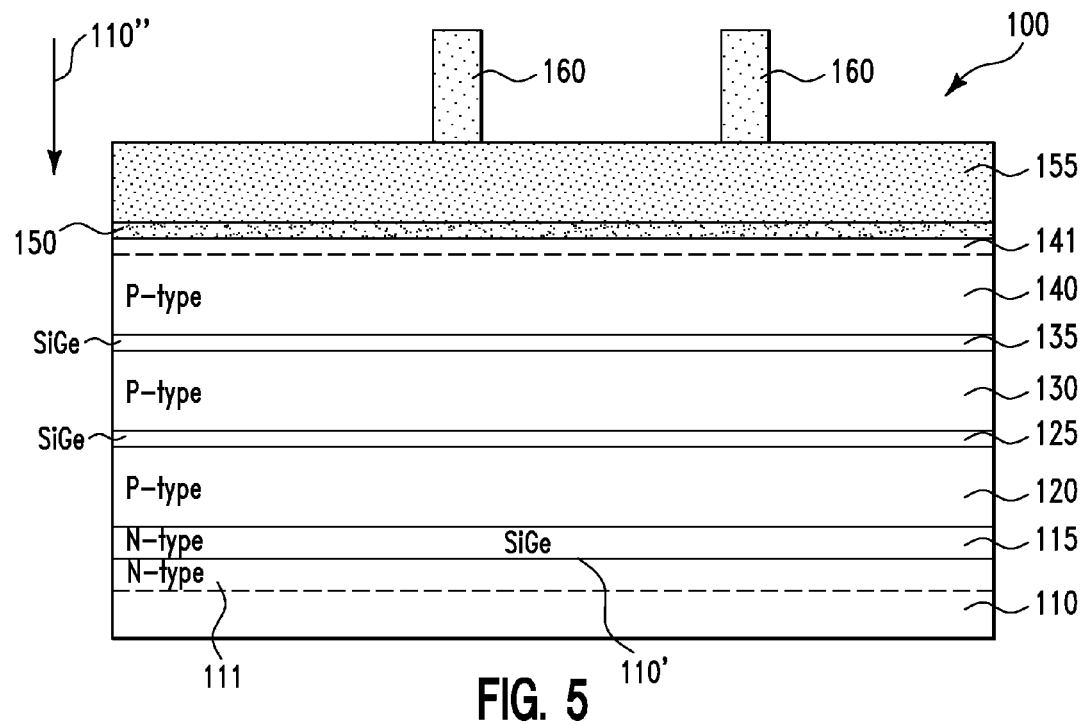
FIG. 5 shows a cross-section view of a semiconductor structure resulting from forming a hard mask layer and photoresist regions on the structure of FIG. 4, in accordance with embodiments of the present invention.

Next, with reference to FIG. 5, in one embodiment, a hard mask layer 150+155 is formed on top of the n-type doped silicon layer 141. The hard mask layer 150+155 can comprise a dioxide layer 150 and a nitride layer 155. The thickness of the dioxide layer 150 in the direction 110" can be around 5 nm, whereas the thickness of the nitride layer 155 in the direction 110" can be around 50-100 n. The hard mask layer 150+155 can be formed by conventional CVD (Chemical Vapor Deposition) processes.

Figure 5A:
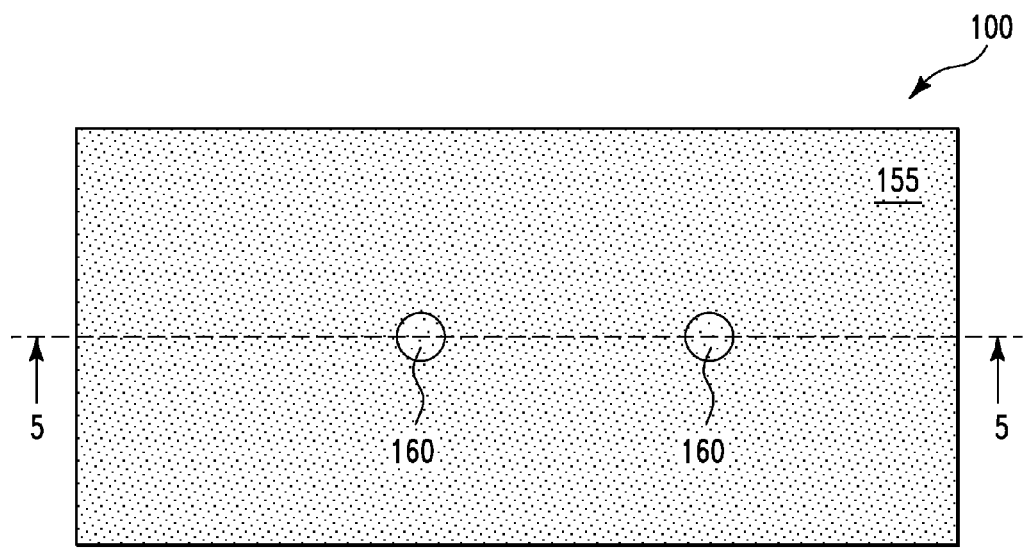
FIG. 5A shows a top-down view of the structure of FIG. 5, in accordance with embodiments of the present invention.

Next, in one embodiment, photoresist regions 160 are formed on top of the nitride layer 155. More specifically, the photoresist regions 160 can be formed by a conventional lithographic process. FIG. 5A shows a top-down view of the structure 100 of FIG. 5, in accordance with embodiments of the present invention. With reference to FIGS. 5 and 5A, it should be noted that FIG. 5 shows a cross-section view of the structure 100 of FIG. 5A along a line 5-5 of FIG. 5A.

Figure 6:
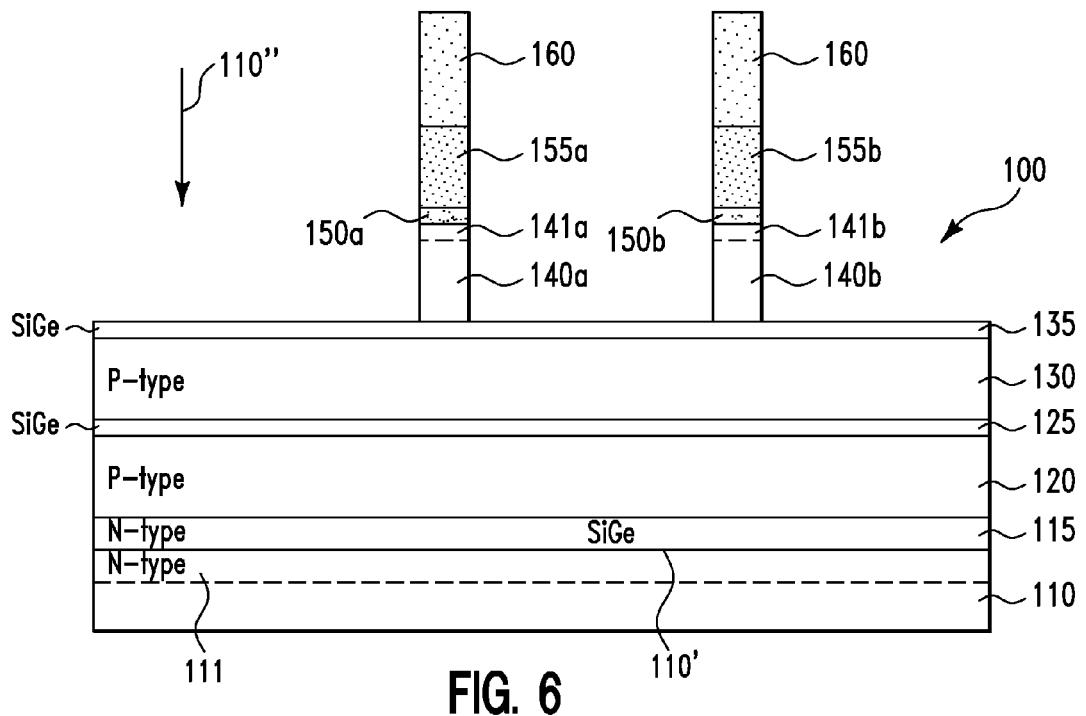
FIG. 6 shows a cross-section view of a semiconductor structure resulting from patterning a nitride layer, an oxide layer, an n-type doped silicon layer, and a p-type doped silicon layer of the structure FIG. 5, in accordance with embodiments of the present invention.

Next, in one embodiment, the nitride layer 155, the oxide layer 150, the n-type doped silicon layer 141, and the p-type doped silicon layer 140 are in turn etched with the photoresist regions 160 as blocking masks resulting in nitride regions 155a and 155b, oxide regions 150a and 150b, n-type doped silicon regions 141a and 141b, p-type doped silicon regions 140a and 140b, as shown in FIG. 6.

Next, with reference to FIG. 6, in one embodiment, the photoresist regions 160 are removed. More specifically, the photoresist regions 160 can be removed by a selective wet etching process.

Next, in one embodiment, the SiGe layer 135 is doped with n-type dopants (e.g., arsenic atoms). More specifically, the SiGe layer 135 can be doped by ion implanting n-type dopants in the direction 110" with the oxide regions 155a and 155b as blocking masks.

Figure 7:
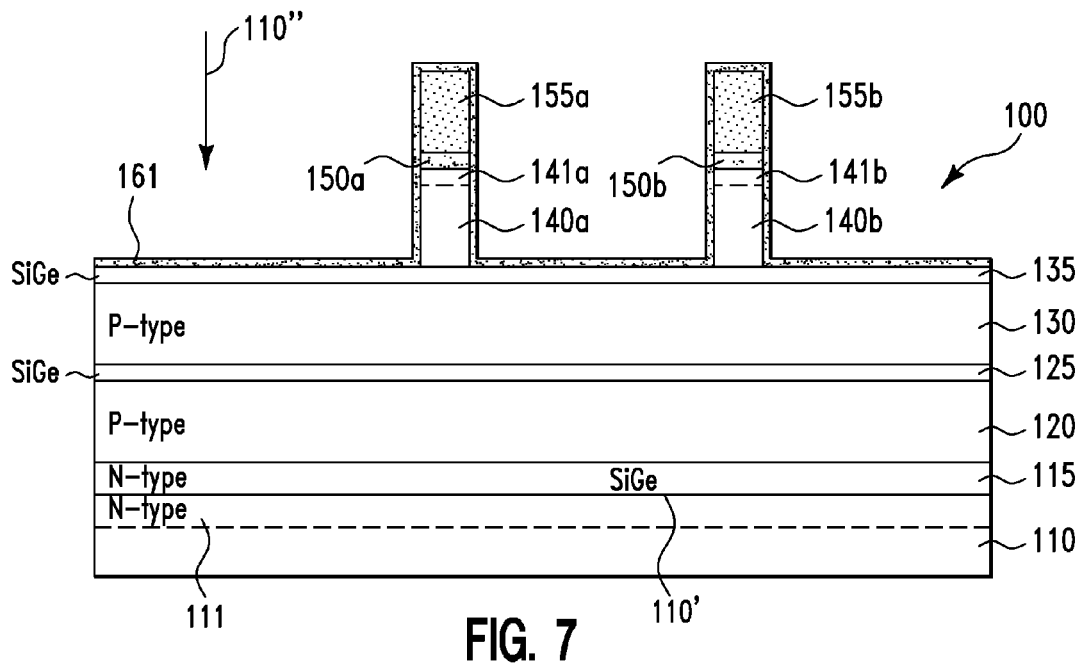
FIG. 7 shows a cross-section view of a semiconductor structure resulting from forming a gate dielectric layer on the structure of FIG. 6, in accordance with embodiments of the present invention.

Next, with reference to FIG. 7, in one embodiment, a gate dielectric layer 161 is formed on top of the structure 100. The gate dielectric layer 161 can comprise silicon dioxide. The thickness of the gate dielectric layer 161 can be around 5-10 nm. The gate dielectric layer 161 can be formed by a conventional CVD process.

Figure 8:
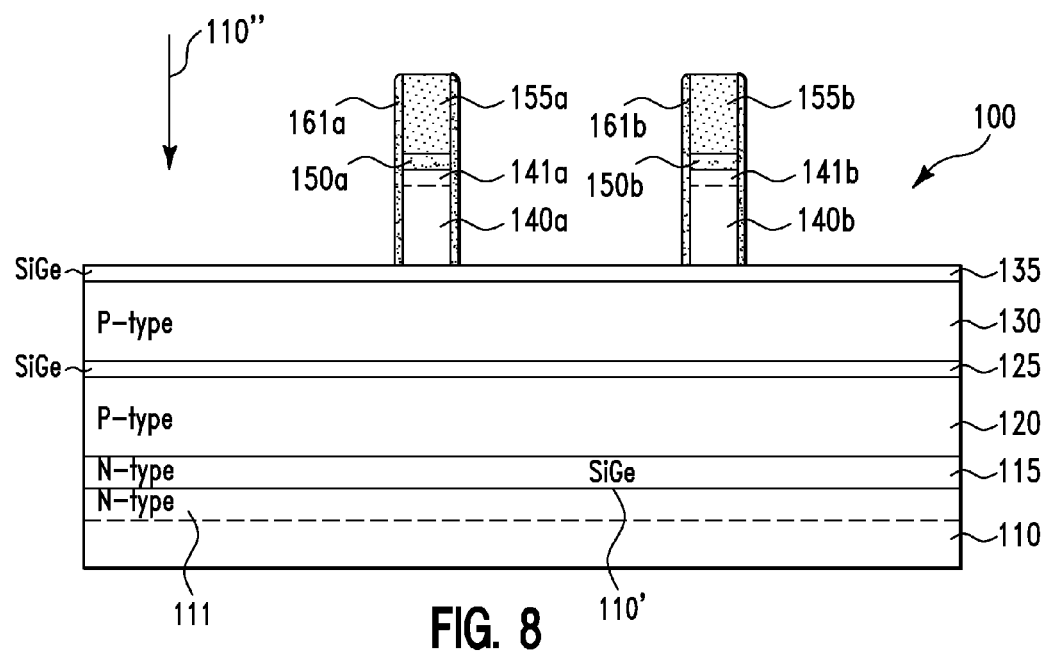
FIG. 8 shows a cross-section view of a semiconductor structure resulting from forming gate dielectric regions on the structure of FIG. 7, in accordance with embodiments of the present invention.
Figure 9:
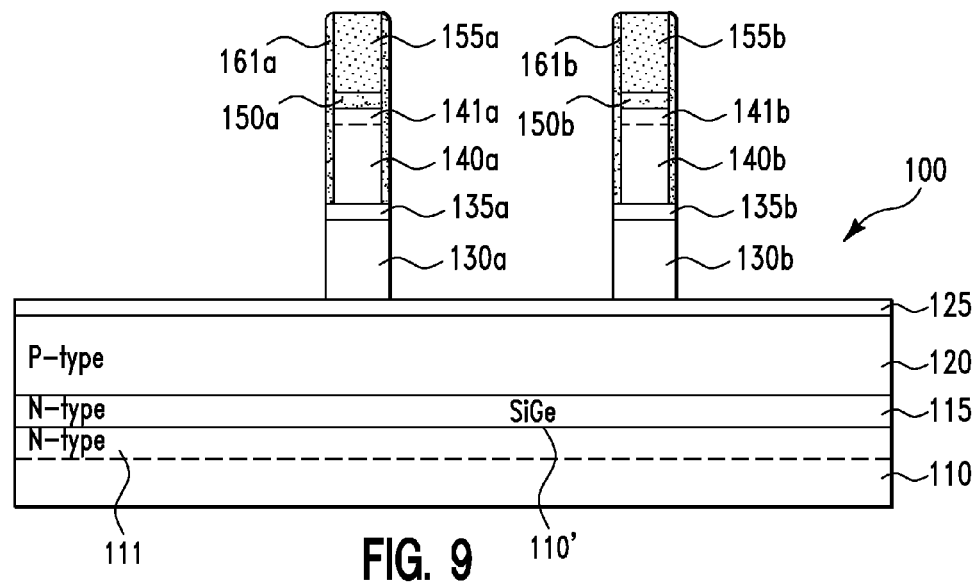
FIG. 9 shows a cross-section view of a semiconductor structure resulting from patterning the n-type doped silicon layer and the third p-type doped silicon layer of the structure of FIG. 8, in accordance with embodiments of the present invention.

Next, in one embodiment, the gate dielectric layer 161 is selectively etched resulting in the gate dielectric regions 161a and 161b of FIG. 8. More specifically, the gate dielectric layer 161 can be selectively etched in the direction 110" resulting in the gate dielectric regions 161a and 161b.

Next, with reference to FIG. 8, in one embodiment, the SiGe layer 135 is selectively etched in the direction 110" with the region 155a+161a and the region 155b+161b as blocking masks resulting in SiGe regions 135a and 135b (FIG. 9), respectively. Next, the p-type doped silicon layer 130 can be selectively etched in the direction 110" with the region 155a+161a and the region 155b+161b as blocking masks resulting in p-type doped silicon regions 130a and 130b (FIG. 9), respectively.

Figure 10:
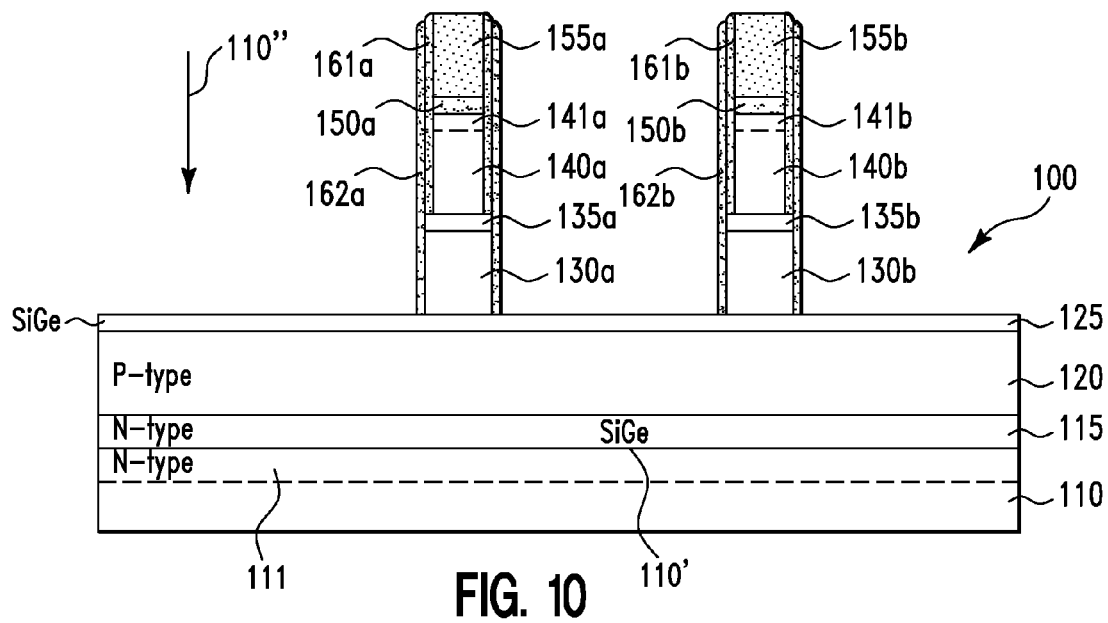
FIG. 10 shows a cross-section view of a semiconductor structure resulting from forming gate dielectric regions on the structure of FIG. 9, in accordance with embodiments of the present invention.

Next, with reference to FIG. 10, gate dielectric regions 162a and 162b are formed on side walls of the gate dielectric regions 161a and 161b, respectively. The gate dielectric regions 162a and 162b can comprise silicon dioxide. The gate dielectric regions 162a and 162b can be formed in a manner similar to the manner in which the gate dielectric regions 161a and 161b are formed.

Figure 11:
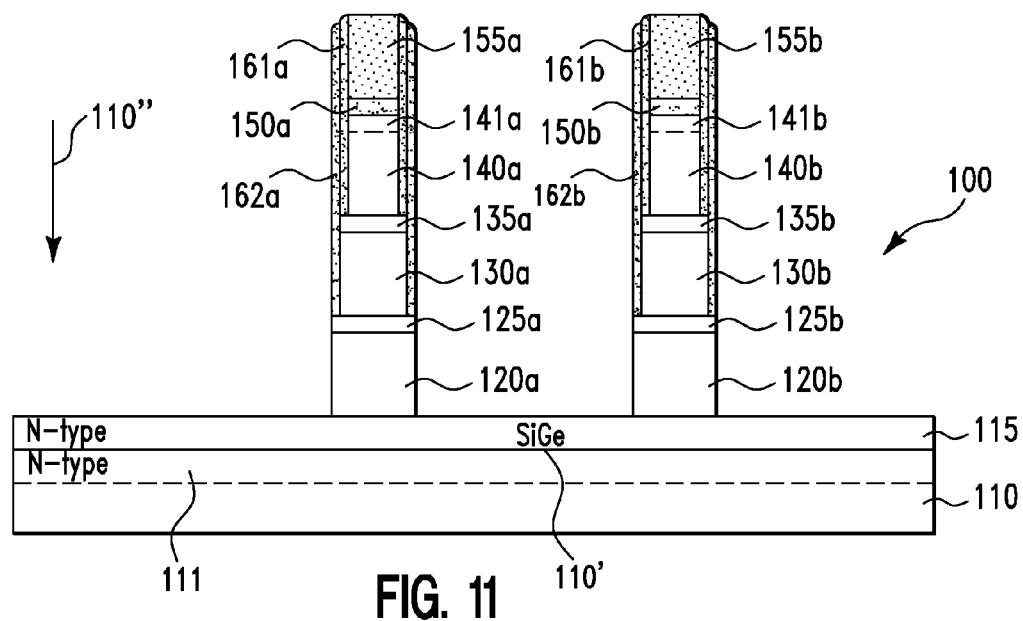
FIG. 11 shows a cross-section view of a semiconductor structure resulting from patterning the first p-type doped silicon layer and the first semiconductor layer of the structure of FIG. 10, in accordance with embodiments of the present invention.

Next, in one embodiment, the SiGe layer 125 and the p-type doped silicon layer 120 are etched in turn in the direction 110" with the region 155a+161a+162a and the region 155b+161b+162b as blocking masks resulting in SiGe regions 125a and 125b and p-type doped silicon regions 120a and 120b, as shown in FIG. 11. The etching of the SiGe layer 125 and the p-type doped silicon layer 120 can be performed in a manner similar to the manner in which the etching of the SiGe layer 135 and the p-type doped silicon layer 130 (FIG. 9) are performed. With reference to FIG. 11, the p-type doped silicon region 140a overlaps p-type doped silicon region 130a in the direction 110", the p-type doped silicon region 130a overlaps p-type doped silicon region 120a in the direction 110". The p-type doped silicon region 140b overlaps p-type doped silicon region 130b in the direction 110", the p-type doped silicon region 130b overlaps p-type doped silicon region 120b in the direction 110". A first region is said to overlap a second region in a reference direction if and only if there exists at least one point inside the first region such that a straight line going through that point and being parallel to the reference direction would intersect the second region.

Figure 12:
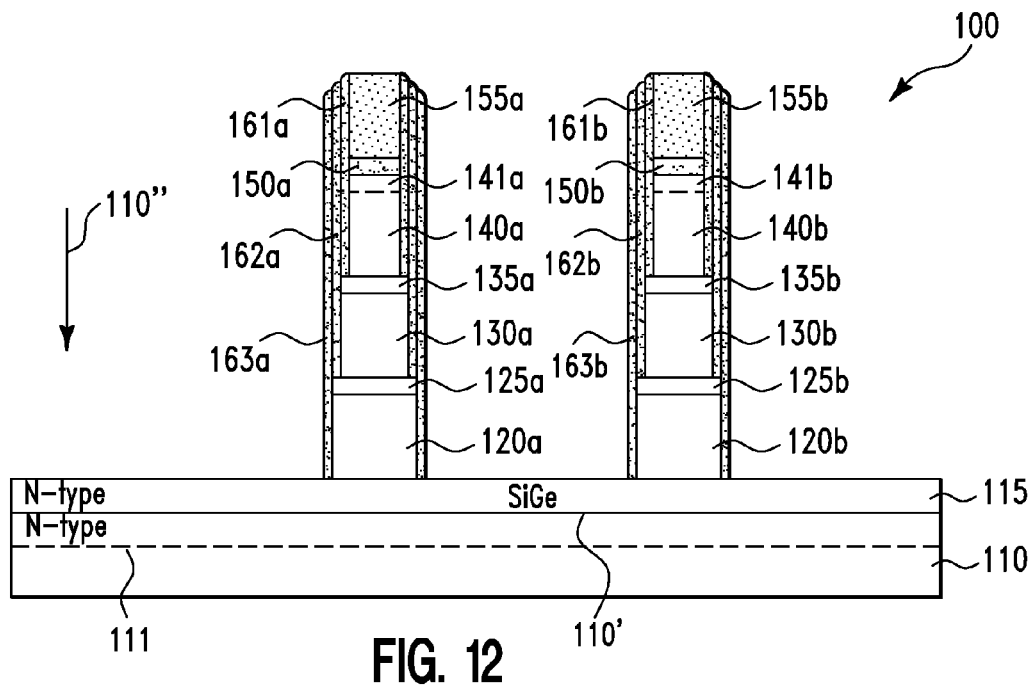
FIG. 12 shows a cross-section view of a semiconductor structure resulting from forming gate dielectric regions on the structure of FIG. 11, in accordance with embodiments of the present invention.

Next, with reference to FIG. 12, in one embodiment, gate dielectric regions 163a and 163b are formed on side walls of the gate dielectric regions 162a and 162b, respectively. The gate dielectric regions 163a and 163b can comprise silicon dioxide. The gate dielectric regions 163a and 163b can be formed in a manner similar to the manner in which the gate dielectric regions 161a and 161b are formed.

Figure 13:
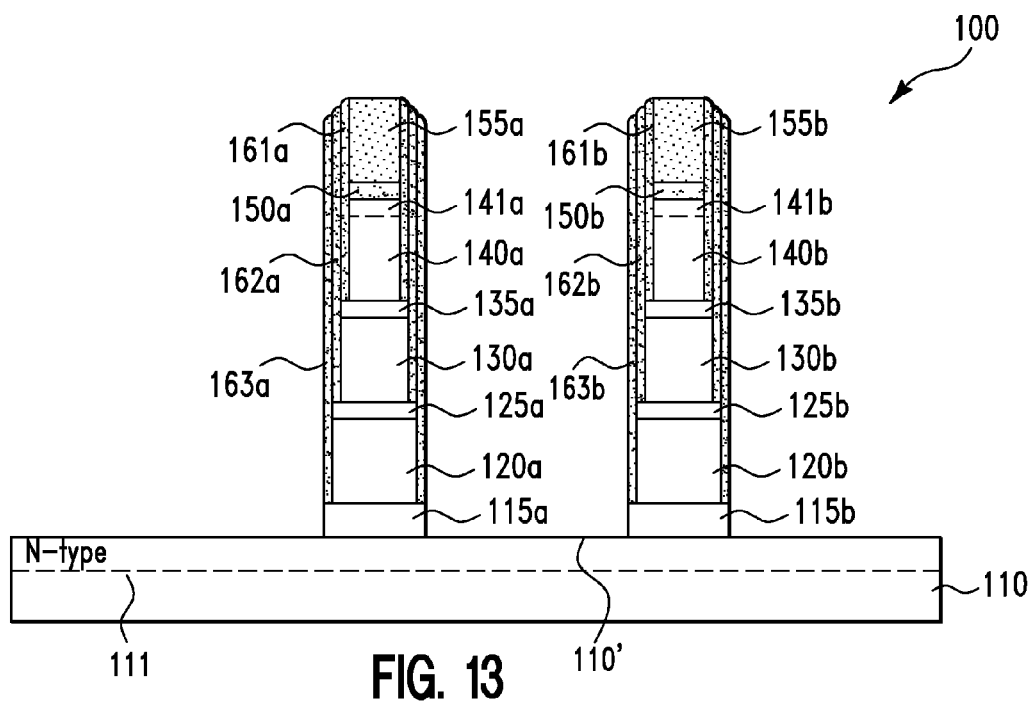
FIG. 13 shows a cross-section view of a semiconductor structure resulting from forming patterning an n-type doped silicon layer of the structure of FIG. 12, in accordance with embodiments of the present invention.

Next, in one embodiment, the n-type doped SiGe layer 115 is etched with the region 155a+161a+162a+163a and the region 155b+161b+162b+163b as blocking masks resulting in n-type doped SiGe regions 115a and 115b of FIG. 13. More specifically, the n-type doped SiGe layer 115 can be selectively etched in the direction 110" with the nitride regions 155a and 155b as blocking masks resulting in the n-type doped SiGe regions 115a and 115b.

Figure 14:
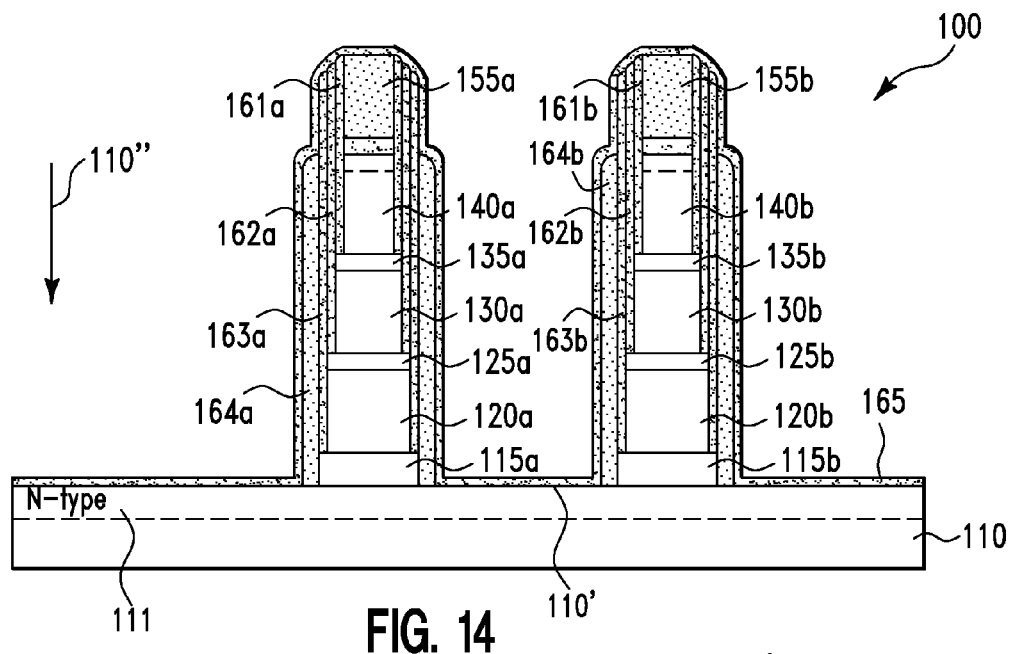
FIG. 14 shows a cross-section view of a semiconductor structure resulting from forming dielectric floating gate regions and a dielectric layer on the structure of FIG. 13, in accordance with embodiments of the present invention.

Next, with reference to FIG. 14, in one embodiment, dielectric floating gate regions 164a and 164b are formed on side walls of the gate dielectric regions 163a and 163b, respectively. The dielectric floating gate regions 164a and 164b can comprise silicon nitride. If silicon nitride is used, the dielectric floating gate regions 164a and 164b can be formed by (i) depositing a silicon nitride layer on top of the structure 100 of FIG. 13 and then (ii) selectively etching the silicon nitride layer in the direction 110" resulting in the dielectric floating gate regions 164a and 164b.

Next, in one embodiment, a dielectric layer 165 is formed on top of the structure 100. The dielectric layer 165 can comprise silicon dioxide. The dielectric layer 165 can be formed by a conventional CVD process.

Figure 15:
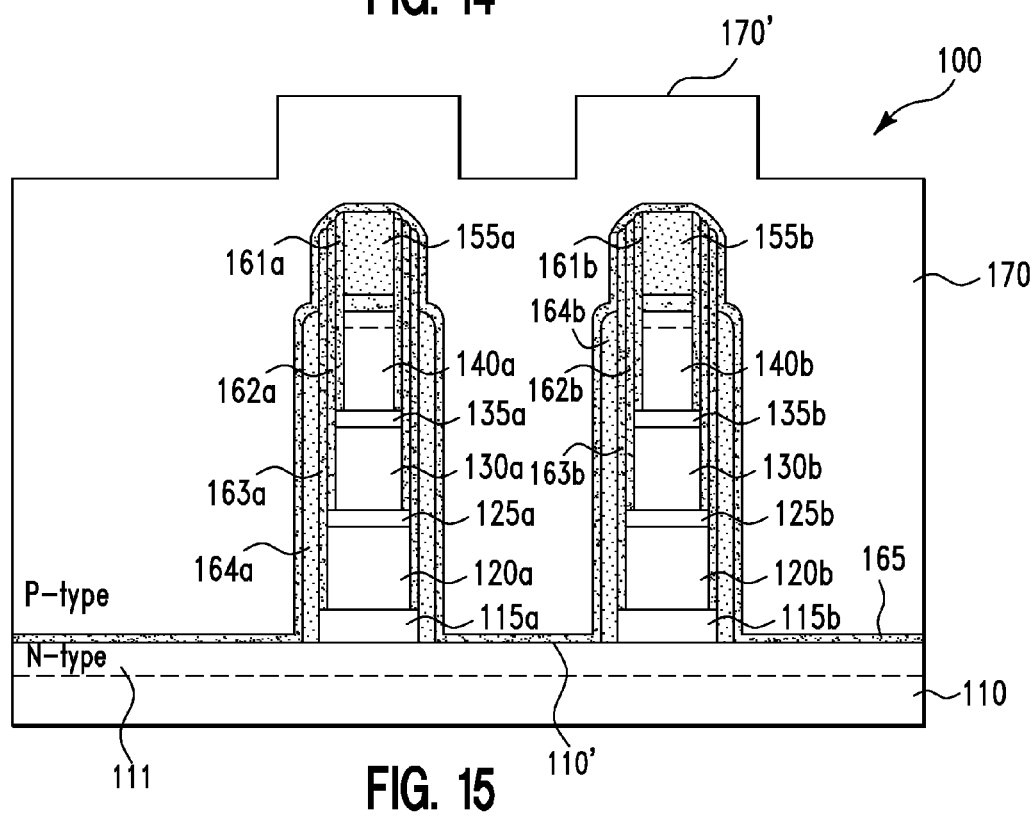
FIG. 15 shows a cross-section view of a semiconductor structure resulting from forming a p-type doped poly-silicon layer on the structure of FIG. 14, in accordance with embodiments of the present invention.

Next, with reference to FIG. 15, in one embodiment, a p-type doped poly-silicon layer 170 is formed on top of the structure 100 of FIG. 14. The p-type doped poly-silicon layer 170 can be formed by (i) depositing poly-silicon with in-situ p-type dopants and then (ii) annealing poly-silicon so as to activate dopants.

Figure 16:
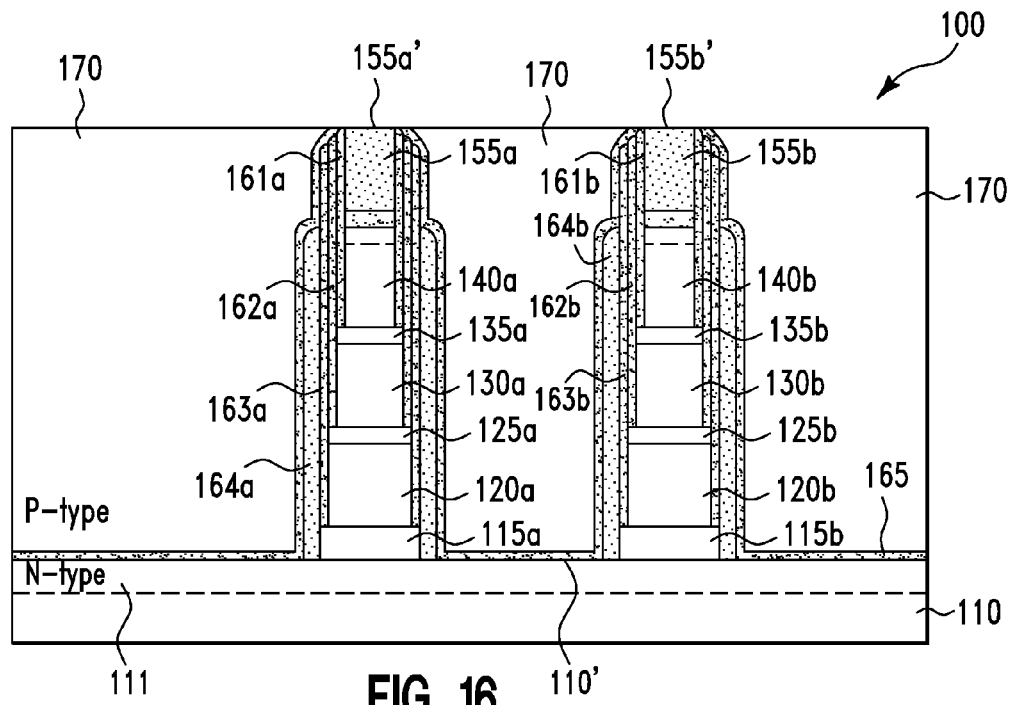
FIG. 16 shows a cross-section view of a semiconductor structure resulting from performing a CMP (Chemical Mechanical Polishing) a top surface of the p-type doped poly-silicon layer of the structure of FIG. 15, in accordance with embodiments of the present invention.

Next, in one embodiment, a CMP (Chemical Mechanical Polishing) process is performed on the top surface 170' of the p-type doped poly-silicon layer 170 until the top surfaces 155a' and 155b' (FIG. 16) of the nitride regions 155a and 155b, respectively, are exposed to the surrounding ambient resulting in the structure 100 of FIG. 16.

Figure 17:
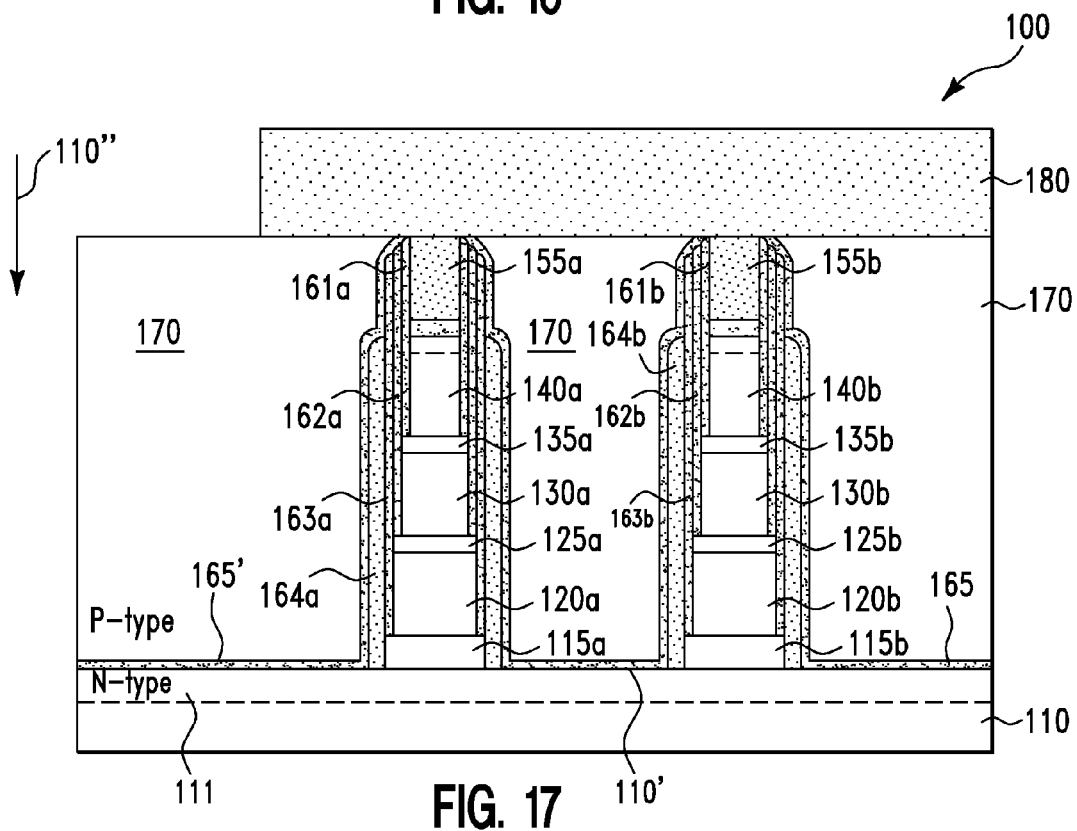
FIG. 17 shows a cross-section view of a semiconductor structure resulting from forming a photoresist region on the structure of FIG. 16, in accordance with embodiments of the present invention.
Figure 17A:
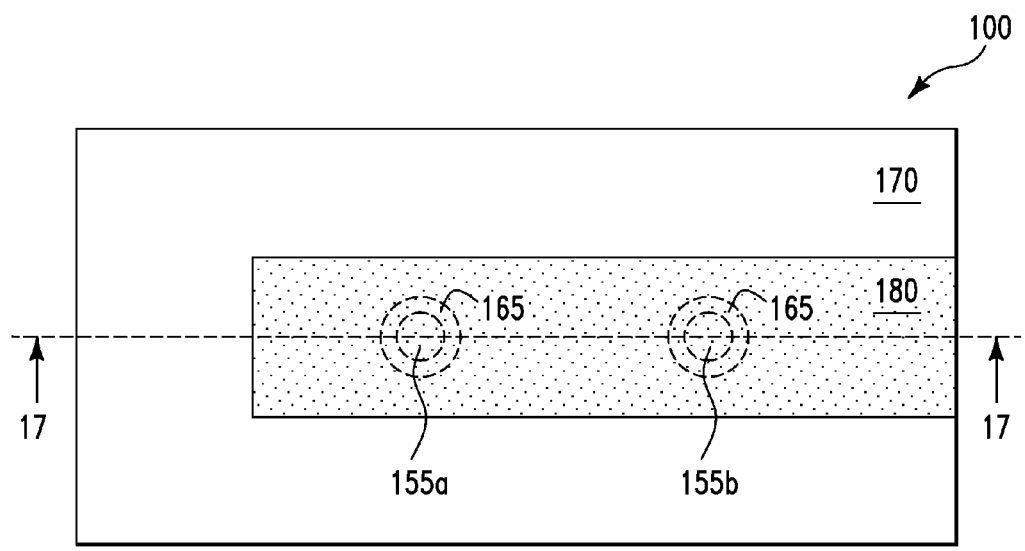
FIG. 17A shows a top-down view of the structure of FIG. 17, in accordance with embodiments of the present invention.

Next, with reference to FIG. 17, in one embodiment, a photoresist region 180 is formed on top of the p-type doped poly-silicon layer 170. The photoresist region 180 can be formed by conventional lithographic process. FIG. 17A shows a top-down view of the structure 100 of FIG. 17, in accordance with embodiments of the present invention. With reference to FIGS. 17 and 17A, it should be noted that FIG. 17 shows a cross-section view of the structure 100 of FIG. 17A along a line 17-17 of FIG. 17A.

Next, in one embodiment, the p-type doped poly-silicon layer 170 is selectively etched in the direction 110" with the photoresist region 180 as a blocking mask until the top surface 165' of the dielectric layer 165 is exposed to the surrounding ambient. Next, the photoresist region 180 can be removed. More specifically, the photoresist region 180 can be removed by a conventional wet etching process.

Figure 18:
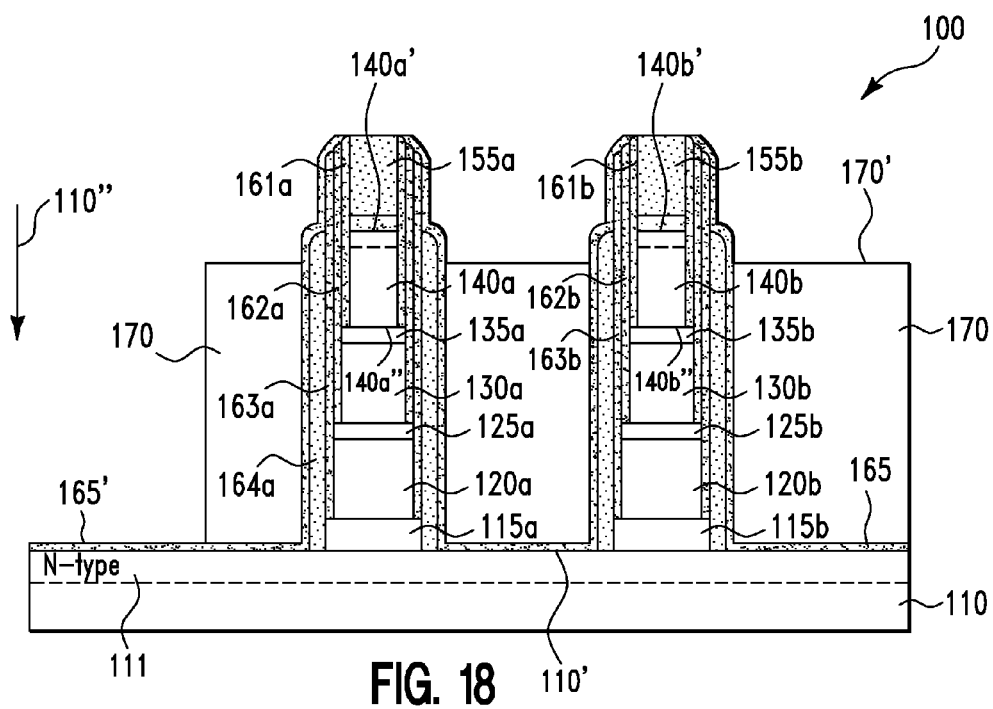
FIG. 18 shows a cross-section view of a semiconductor structure resulting from performing a first selective and directional etching step on the structure of FIG. 17, in accordance with embodiments of the present invention.

Next, in one embodiment, a selective and directional etching step is performed on the remaining portion of the p-type doped poly-silicon layer 170 in the direction 110" such that the top surface 170' is lower than the top surfaces 140a' and 140b' in the direction 110", but higher than the bottom surfaces 140a" and 140b" in the direction 110" resulting in the p-type doped poly-silicon region 170 of FIG. 18.

Figure 19:
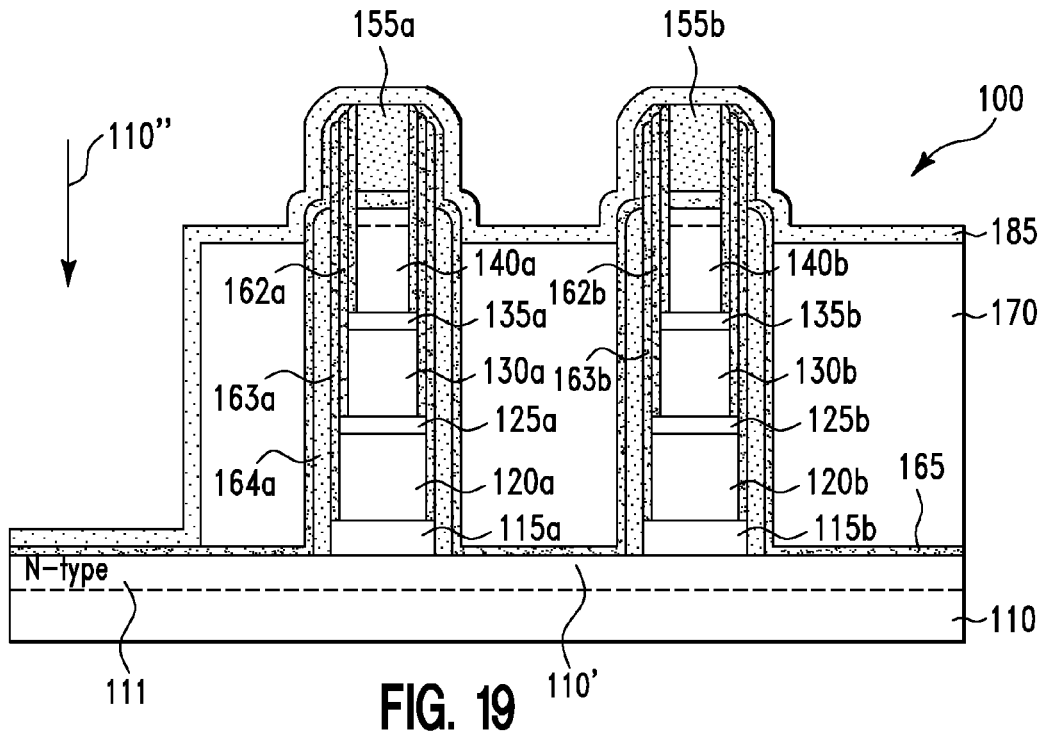
FIG. 19 shows a cross-section view of a semiconductor structure resulting from forming a spacer layer on the structure of FIG. 18, in accordance with embodiments of the present invention.

Next, with reference to FIG. 19, in one embodiment, a spacer layer 185 is formed on top of the semiconductor structure 100 of FIG. 18. The spacer layer 185 can comprise silicon nitride. If silicon nitride is used, the nitride layer 185 can be formed by CVD of silicon nitride on top of the structure 100 of FIG. 18 resulting in the nitride layer 185.

Figure 20:
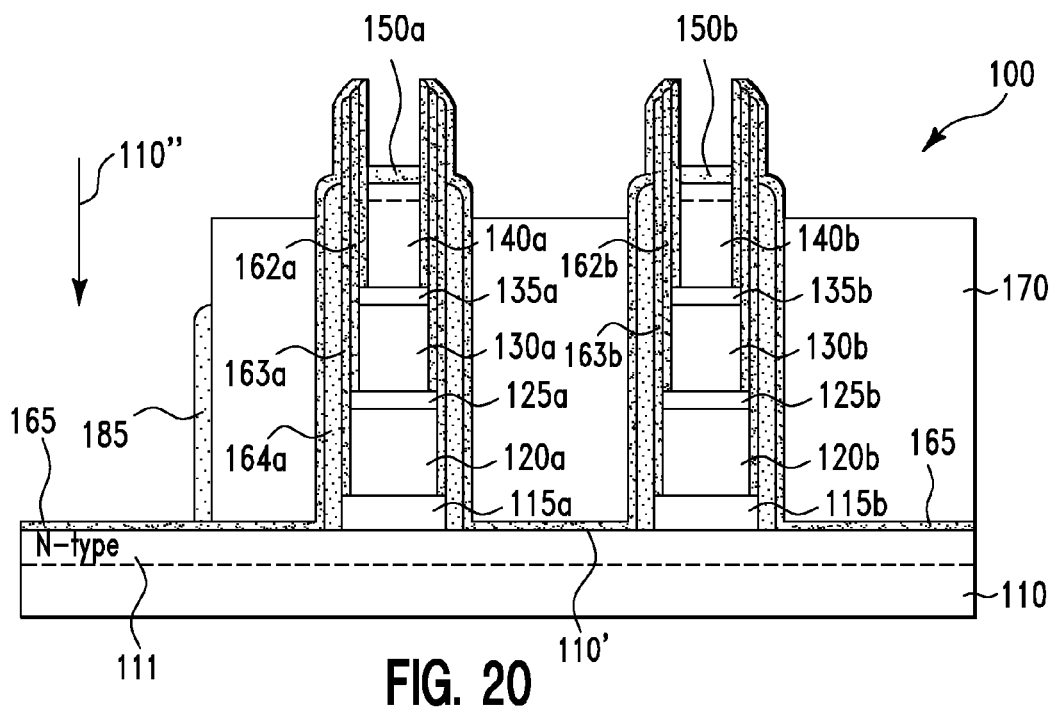
FIG. 20 shows a cross-section view of a semiconductor structure resulting from performing a second selective etching step on the structure of FIG. 19, in accordance with embodiments of the present invention.

Next, in one embodiment, a selective etching step is performed on the nitride layer 185 and the nitride regions 155a and 155b (FIG. 19) resulting in a nitride region 185 of FIG. 20. Also as a result of this etching step, the nitride regions 155a and 155b are removed. This selective etching step can be performed in the direction 110".

Figure 21:
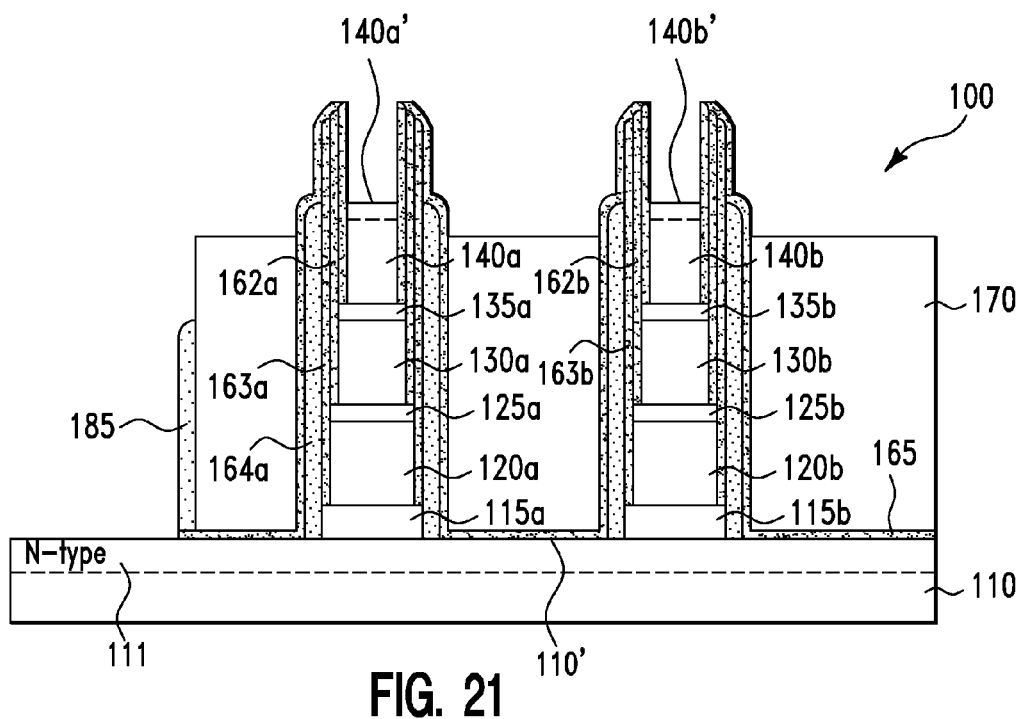
FIG. 21 shows a cross-section view of a semiconductor structure resulting from performing a third selective etching step on the structure of FIG. 20, in accordance with embodiments of the present invention.
Figure 21A:
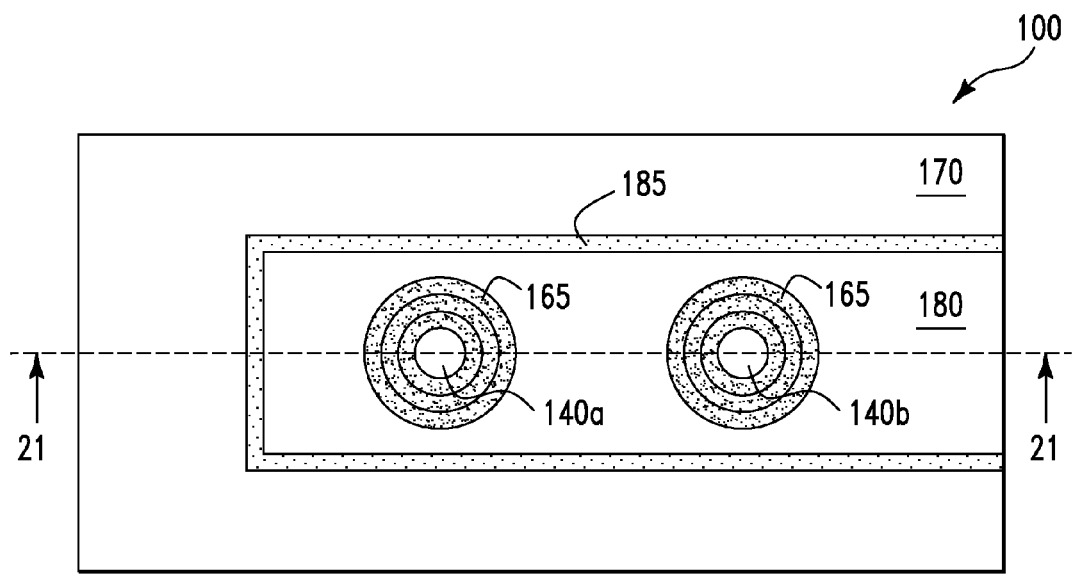
FIG. 21A shows a top-down view of the structure of FIG. 21, in accordance with embodiments of the present invention.

Next, in one embodiment, a selective etching step is performed on the oxide layer 165 and the oxide regions 150a and 150b until the top surface 110' of the substrate 110 and the top surfaces 140a' and 140b' of the p-type doped silicon regions 140a and 140b, respectively, are exposed to the surrounding ambient resulting in the semiconductor structure 100 of FIG. 21. This etching step can be performed in the direction 110". FIG. 21A shows a top-down view of the structure 100 of FIG. 21, in accordance with embodiments of the present invention. With reference to FIGS. 21 and 21A, it should be noted that FIG. 21 shows a cross-section view of the structure 100 of FIG. 21A along a line 21-21 of FIG. 21A.

Figure 22:
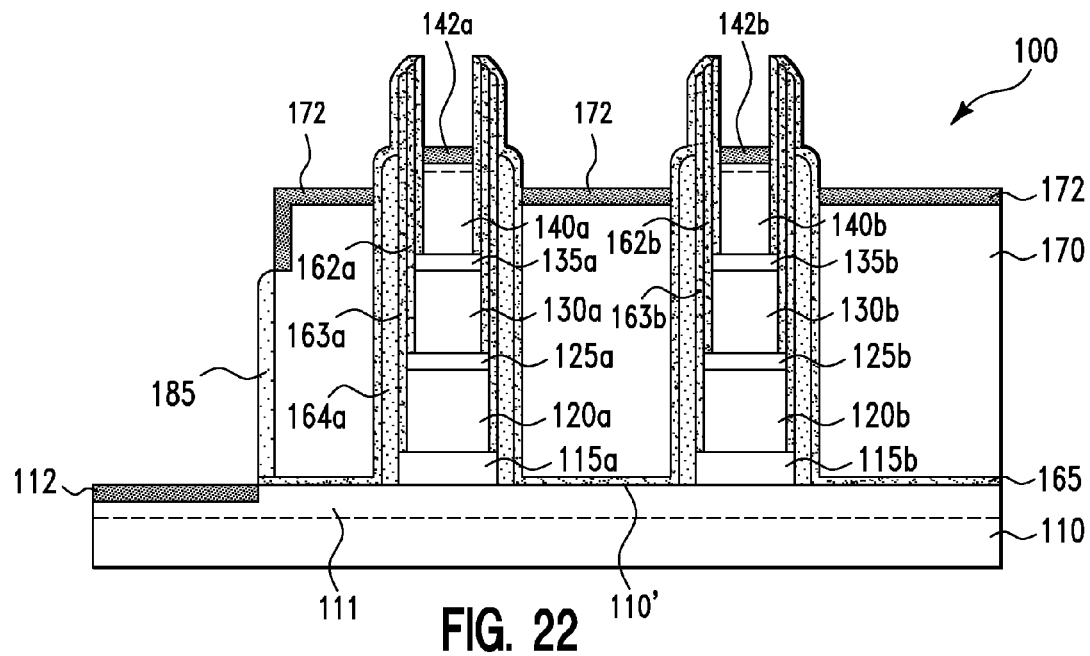
FIG. 22 shows a cross-section view of a semiconductor structure resulting from forming electrically conductive regions on the structure of FIG. 21, in accordance with embodiments of the present invention.

Next, with reference to FIG. 22, in one embodiment, electrically conductive regions 112, 172, 142a, and 142b are formed on the substrate 110, the p-type doped poly-silicon region 170, the p-type doped silicon region 140a, and p-type doped silicon region 140b, respectively. The electrically conductive regions 112, 172, 142a, and 142b can comprise silicide nickel. If silicide nickel is used, the silicide regions 112, 172, 142a, and 142b can be formed by (i) depositing a nickel layer (not shown) on top of the semiconductor structure 100 of FIG. 21, then (ii) heating the semiconductor structure 100 resulting in the silicide regions 112, 172, 142a, and 142b, and then (iii) removing unreacted nickel.

Figure 23:
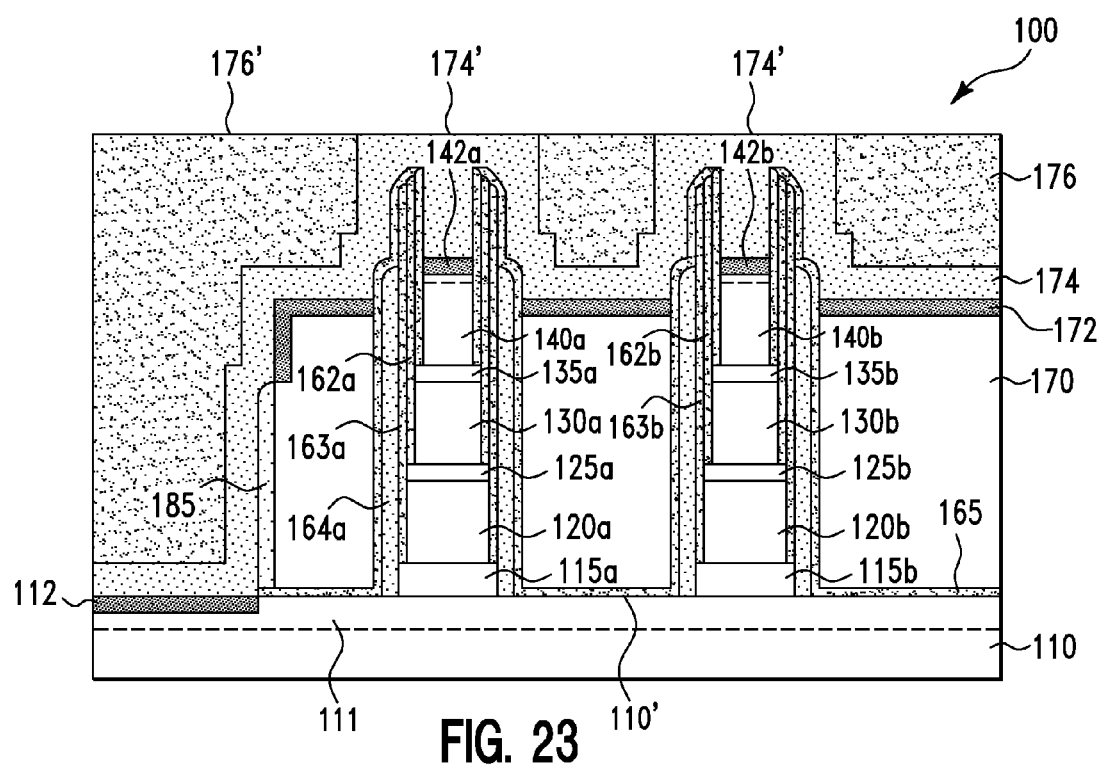
FIG. 23 shows a cross-section view of a semiconductor structure resulting from forming dielectric layers on the structure of FIG. 22, in accordance with embodiments of the present invention.

Next, with reference to FIG. 23, in one embodiment, a dielectric layer 174 is formed on top of the semiconductor structure 100 of FIG. 22. The dielectric layer 174 can comprise silicon nitride. If silicon nitride is used, the nitride layer 174 can be formed by CVD of silicon nitride on top of the structure 100 of FIG. 22 resulting in the dielectric layer 174.

Next, in one embodiment, a dielectric layer 176 is formed on top of the nitride layer 174. The dielectric layer 176 can comprise silicon dioxide. If silicon dioxide is used, the oxide layer 176 can be formed by (i) depositing a silicon dioxide layer (not shown) on top of the nitride layer 174 and then (ii) polishing the top surface 176' of the silicon dioxide layer until the top surfaces 174' of the nitride layer 174 are exposed to the surrounding ambient resulting in the oxide layer 176 of FIG. 23.

Figure 24:
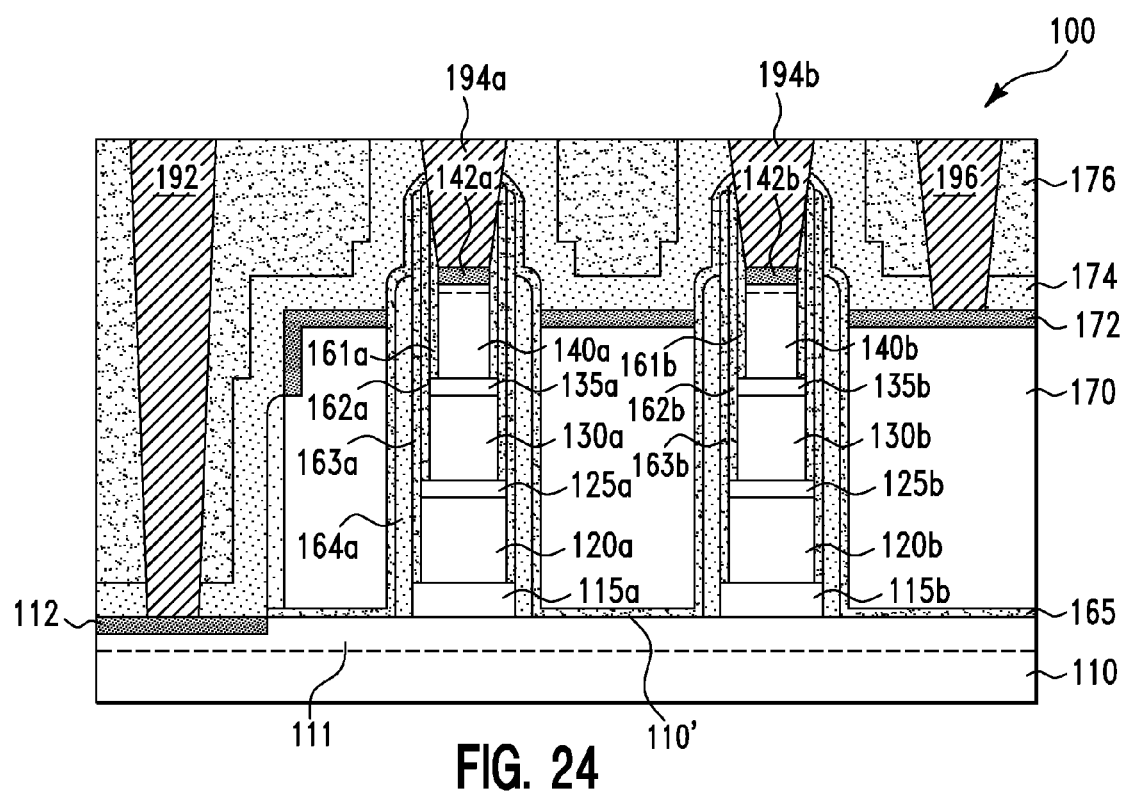
FIG. 24 shows a cross-section view of a semiconductor structure resulting from forming vias on the structure of FIG. 23, in accordance with embodiments of the present invention.

Next, with reference to FIG. 24, in one embodiment, vias 192, 196, 194a, and 194b are formed so as to provide electrical access to the silicide regions 112, 172, 142a, and 142b, respectively. The vias 192, 196, 194a, and 194b can comprise a metal such as copper. The vias 192, 196, 194a, and 194b can be formed by a conventional method.

With reference to FIG. 24, the p-type doped silicon region 120a, the gate dielectric region 163a, and the p-type doped poly-silicon region 170 can constitute a bottom flash transistor having the body region 120a, the gate dielectric region 163a, and the control gate electrode region 170, respectively. The p-type doped silicon region 130a, the gate dielectric region 162a+163a, and the p-type doped poly-silicon region 170 can constitute a middle flash transistor having the body region 130a, the gate dielectric region 162a+163a, and the control gate electrode region 170, respectively. The p-type doped silicon region 140a, the gate dielectric region 161a+162a+163a, and the p-type doped poly-silicon region 170 can constitute a top flash transistor having the body region 140a, the gate dielectric region 161a+162a+163a, and the control gate electrode region 170, respectively. The bottom, middle, and top flash transistors share the same control gate electrode region 170 and the same dielectric floating gate region 164a. Because the thicknesses of the gate dielectric regions of the bottom, middle, and top flash transistors are different from one another, these flash transistors have different threshold voltages. Therefore, these flash transistors can constitute (i.e., can be electrically connected together so as to form) a multiple bit flash memory cell that can store more than one bit of information. These flash transistors are formed on top of one another, therefore, these flash transistors occupy less wafer area.

In one embodiment, three flash transistors on the right are similar to the bottom, middle, and top flash transistors on the left.

Figure 25:
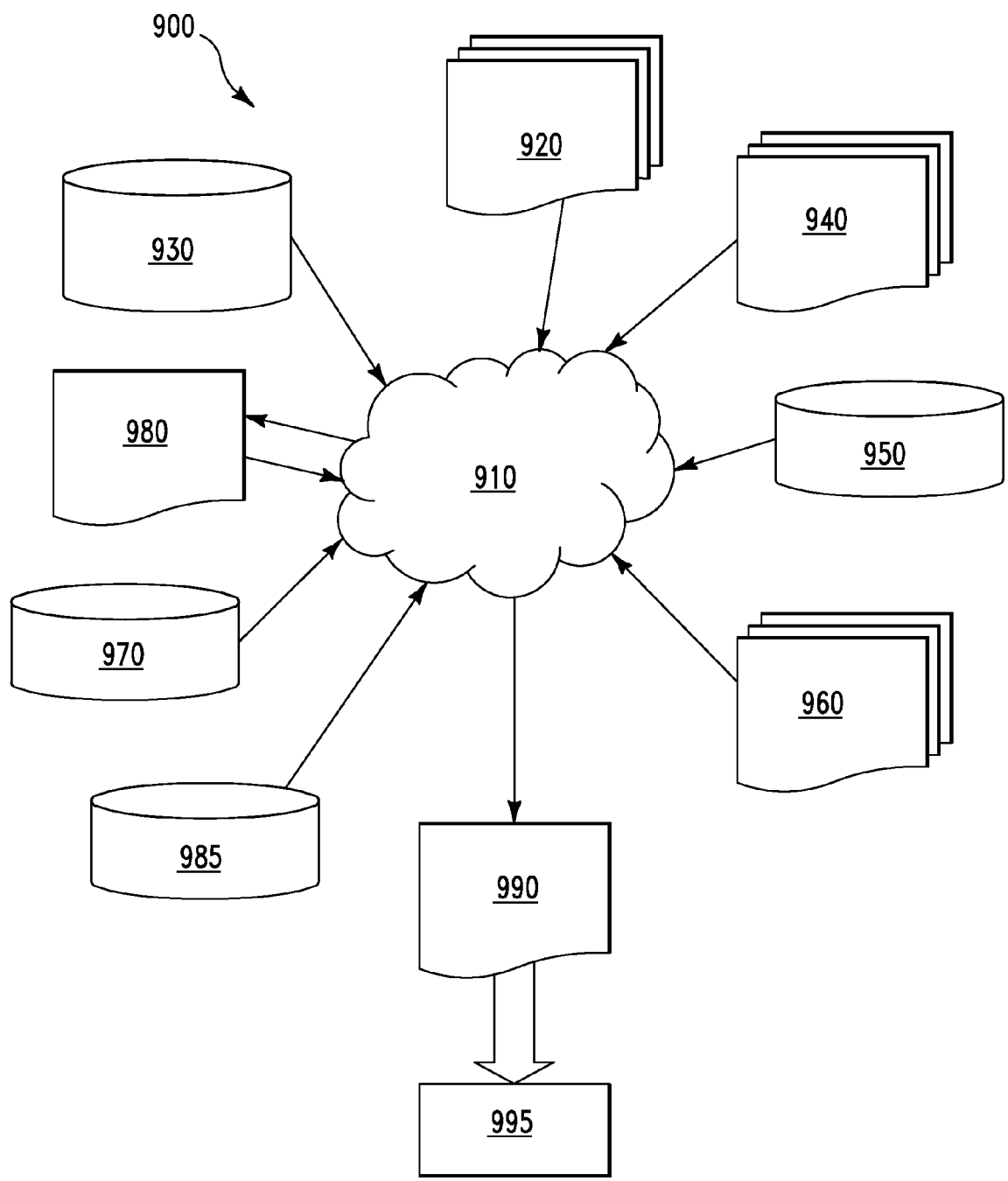
FIG. 25 is a flow diagram of a design process used in semiconductor design, manufacture, and/or test.

FIG. 25 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIG. 24. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 25 illustrates multiple such design structures including an input design structure 920 that is preferably processed by a design process 910. In one embodiment, the design structure 920 comprises design data used in a design process and comprising information describing an embodiment of the invention with respect to the structure as shown in FIG. 24. The design data in the form of schematics or HDL, a hardware-description language (e.g., Verilog, VHDL, C, etc.) may be embodied on one or more machine readable media. For example, design structure 920 may be a text file, numerical data or a graphical representation of an embodiment of the invention as shown in FIG. 24. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 24. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 24 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 24. In one embodiment, design structure 990 may comprise a compiled, executable HDL simulation model that functionally simulates the devices shown in FIG. 24.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 24. Design structure 990 may then proceed to a stage 995 where, for example, design structure 990: proceeds to tape-out, is released to manufacturing, is released to a mask house, is sent to another design house, is sent back to the customer, etc.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
   a semiconductor substrate which includes a top substrate surface, wherein the top substrate surface defines a first reference direction that is perpendicular to the top substrate surface;
   a control gate electrode region on and above the semiconductor substrate;
   a first semiconductor body region on and above the semiconductor substrate, wherein the first reference direction is directed from the top substrate surface toward the first semiconductor body region;
   a second semiconductor body region on and above the first semiconductor body region, wherein the second semiconductor body region overlaps the first semiconductor body region in the first reference direction;
   a first gate dielectric region on and in direct physical contact with side walls of the first semiconductor body region, wherein the first gate dielectric region is disposed between the first semiconductor body region and the control gate electrode region; and
   a second gate dielectric region on and in direct physical contact with side walls of the second semiconductor body region,
   wherein the second gate dielectric region is disposed between the second semiconductor body region and the control gate electrode region,
      wherein a thickness of the first gate dielectric region in a second reference direction is less than a thickness of the second gate dielectric region in the second reference direction,
      wherein the second reference direction is perpendicular to the first reference direction and to a side wall of the side walls of the first semiconductor body region,
      wherein a first portion of the first gate dielectric region overlaps the second gate dielectric region in the first reference direction,
      wherein a second portion of the first gate dielectric region extends below the second gate dielectric region in a direction opposite the first reference direction,
      wherein the control gate electrode region comprises a bottom surface and a top surface which collectively bound the control gate electrode region in the first reference direction,
      wherein a bottom surface of the first semiconductor body region is above the bottom surface of the control gate electrode region in the first reference direction,
      wherein the top surface of the control gate electrode region is above the second semiconductor body region in the first reference direction, and
      wherein the control gate electrode region comprises polysilicon which is continuously distributed from the bottom surface of the control gate electrode region to the top surface of the control gate electrode region.

2. The structure of claim 1, further comprising:
   a third semiconductor body region on and above the second semiconductor body region;

a third gate dielectric region on and in direct physical contact with side walls of the third semiconductor body region,
wherein the third gate dielectric region is disposed between the third semiconductor body region and the control gate electrode region,
wherein the thickness of the second gate dielectric region in the second reference direction is less than a thickness of the third gate dielectric region in the second reference direction, and
wherein a first portion of the second gate dielectric region overlaps the third gate dielectric region in the first reference direction,
wherein a second portion of the second gate dielectric region extends below the third gate dielectric region in the direction opposite the first reference direction.

3. The structure of claim 2, further comprising a dielectric floating gate region,
wherein the dielectric floating gate region is disposed between the control gate electrode region and the first gate dielectric region,
wherein the dielectric floating gate region is disposed between the control gate electrode region and the second gate dielectric region,
wherein the dielectric floating gate region is disposed between the control gate electrode region and the third gate dielectric region, and
wherein the dielectric floating gate region is in direct physical contact with the first gate dielectric region, the second gate dielectric region, and the third gate dielectric region.

4. The structure of claim 3, wherein the dielectric floating gate region comprises silicon nitride.

5. The structure of claim 2, wherein the first, second, and third semiconductor body regions comprise silicon.

6. The structure of claim 2,
wherein the first, second, and third gate dielectric regions comprise silicon dioxide.

7. The structure of claim 2, further comprising:
a first semiconductor connecting region, wherein the first semiconductor connecting region is disposed between and in direct physical contact with the semiconductor substrate and the first semiconductor body region;
a second semiconductor connecting region, wherein the second semiconductor connecting region is disposed between and in direct physical contact with the first semiconductor connecting region and the second semiconductor body region; and
a third semiconductor connecting region, wherein the third semiconductor connecting region is disposed between and in direct physical contact with the second semiconductor connecting region and the third semiconductor body region.

8. The structure of claim 1, wherein a thickness of the first semiconductor body region in the second reference direction exceeds a thickness of the second semiconductor body region in the second reference direction.

9. The structure of claim 1, wherein the semiconductor structure further comprises a dielectric layer disposed between and in direct physical contact with the bottom surface of the control gate electrode region and the top substrate surface, and wherein the bottom surface of the first semiconductor body region is above as top surface of the dielectric layer in the first reference direction.

10. The structure of claim 2, wherein a thickness of the first semiconductor body region in the second reference direction exceeds a thickness of the second semiconductor body region in the second reference direction, and wherein the thickness of the second semiconductor body region in the second reference direction exceeds a thickness of the third semiconductor body region in the second reference direction.

11. The structure of claim 3, wherein a top surface of the dielectric floating gate region is above the top surface of the control gate electrode region in the first reference direction, and wherein a bottom surface of the dielectric floating gate region is in direct physical contact with the top substrate surface.

12. The structure of claim 7, wherein a thickness of the first semiconductor connecting region in the second reference direction exceeds a thickness of the second semiconductor connecting region in the second reference direction, and wherein the thickness of the second semiconductor connecting region in the second reference direction exceeds a thickness of the third semiconductor connecting region in the second reference direction.

13. The structure of claim 7, wherein the first semiconductor connecting region comprises a first mixture of silicon and germanium, wherein the second semiconductor connecting region comprises a second mixture of silicon and germanium, and wherein the third semiconductor connecting region comprises a third mixture of silicon and germanium.

* * * * *